US011417749B2

(12) United States Patent
Singh et al.

(10) Patent No.: US 11,417,749 B2
(45) Date of Patent: Aug. 16, 2022

(54) SEMICONDUCTOR ARRANGEMENT WITH AIRGAP AND METHOD OF FORMING

(71) Applicant: TAIWAN SEMICONDUCTOR MANUFACTURING COMPANY LIMITED, Hsin-Chu (TW)

(72) Inventors: Gulbagh Singh, Tainan (TW); Wang Po-Jen, Taichung (TW); Kun-Tsang Chuang, Miaoli (TW); Tsung-Han Tsai, Zhunan Township (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/441,200

(22) Filed: Jun. 14, 2019

(65) Prior Publication Data

US 2020/0395459 A1    Dec. 17, 2020

(51) Int. Cl.
| | |
|---|---|
| *H01L 29/76* | (2006.01) |
| *H01L 29/49* | (2006.01) |
| *H01L 29/45* | (2006.01) |
| *H01L 29/51* | (2006.01) |
| *H01L 21/285* | (2006.01) |
| *H01L 21/311* | (2006.01) |
| *H01L 21/764* | (2006.01) |
| *H01L 21/28* | (2006.01) |
| *H01L 21/02* | (2006.01) |

(52) U.S. Cl.
CPC .... *H01L 29/4991* (2013.01); *H01L 21/02167* (2013.01); *H01L 21/28123* (2013.01); *H01L 21/28518* (2013.01); *H01L 21/31116* (2013.01); *H01L 21/764* (2013.01); *H01L 29/45* (2013.01); *H01L 29/51* (2013.01)

(58) Field of Classification Search
None
See application file for complete search history.

(56) References Cited

U.S. PATENT DOCUMENTS

| | | | |
|---|---|---|---|
| 7,553,756 B2* | 6/2009 | Hayashi | H01L 21/76802 257/522 |
| 8,232,618 B2* | 7/2012 | Breyta | H01L 21/31144 257/522 |
| 2002/0047207 A1* | 4/2002 | Sekiguchi | H01L 23/5329 257/758 |
| 2016/0141240 A1* | 5/2016 | Saka | H01L 23/4824 257/401 |
| 2017/0330832 A1* | 11/2017 | He | H01L 21/7682 |

FOREIGN PATENT DOCUMENTS

TW    201806126 A    2/2018

* cited by examiner

*Primary Examiner* — Hung K Vu
(74) *Attorney, Agent, or Firm* — Cooper Legal Group LLC

(57) ABSTRACT

A semiconductor arrangement includes a gate structure disposed between a first source/drain region and a second source/drain region and a first contact disposed over the first source/drain region. The semiconductor arrangement includes a second contact disposed over the second source/drain region and an airgap disposed between the first contact and the second contact and over the gate structure.

20 Claims, 15 Drawing Sheets

SEMICONDUCTOR ARRANGEMENT WITH AIRGAP AND METHOD OF FORMING

BACKGROUND

A semiconductor arrangement has an off-state capacitance while in an off state. The off-state capacitance includes a device capacitance and a wiring capacitance. The device capacitance is caused by the capacitances between layers of a device, such as a transistor, within the semiconductor arrangement. The wiring capacitance is caused by the capacitances between layers of a contact structure and the device. High off-state capacitances increase time delay and decrease switching performance of the semiconductor arrangement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
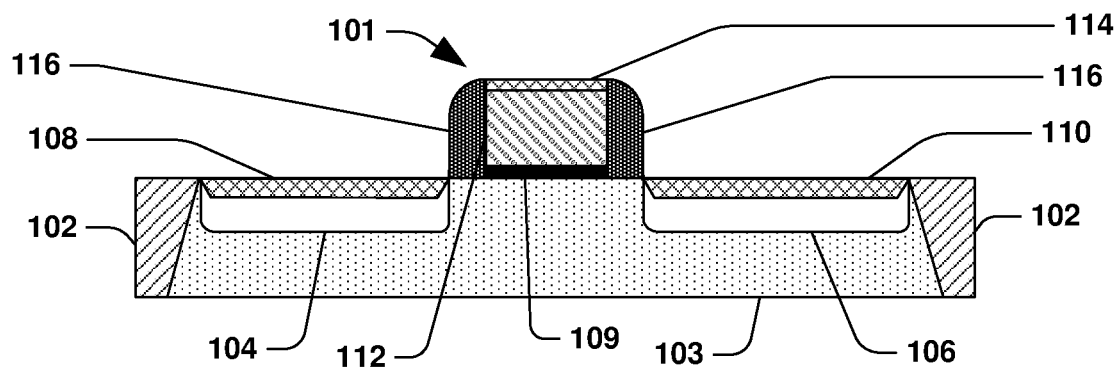
FIG. 1A-1J and 2 are illustrations of cross-sectional views of a semiconductor arrangement at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As provided herein, in some embodiments a semiconductor arrangement is formed to have an airgap. In some embodiments, the semiconductor arrangement comprises a transistor having a gate structure and a plurality of source/drain regions. In some embodiments, the airgap is formed over the gate structure and between a first contact electrically coupled to a first source/drain region of the semiconductor arrangement and a second contact electrically coupled to a first source/drain region of the semiconductor arrangement. In some embodiments, the airgap is formed over the gate structure and between a first metal structure overlying the first contact and a second metal structure overlying the second contact.

In some embodiments, the airgap comprises air or other suitable gases having a low dielectric constant. In some embodiments, because of the low dielectric constant, wiring capacitances between at least one of the gate structure and the contacts or the gate structure and the metal structures are reduced. In some embodiments, the airgap reduces an off-state capacitance of the semiconductor arrangement by about 40% or more. In some embodiments, reducing the off-state capacitance improves a resistance-capacitance (RC) time delay of the semiconductor arrangement and improves radio frequency (RF) switching of the semiconductor arrangement.

Figure 1B:
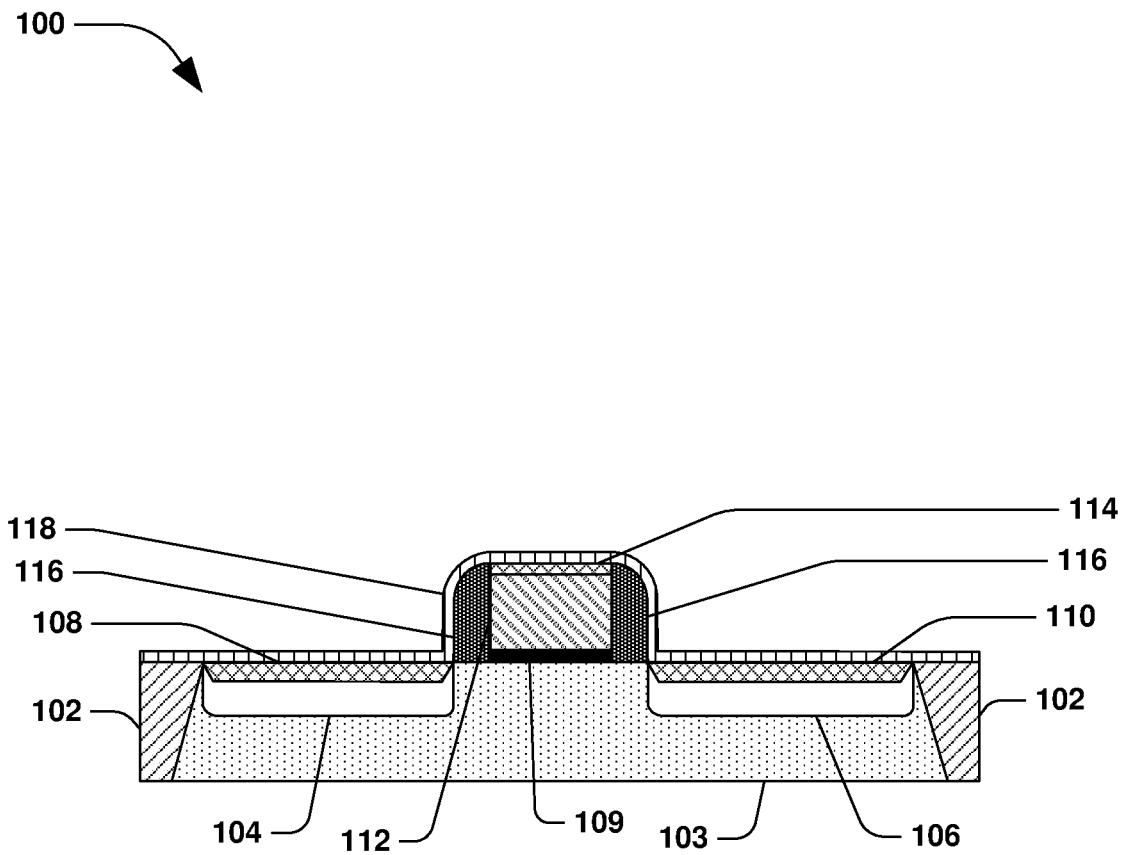
Figure 1C:
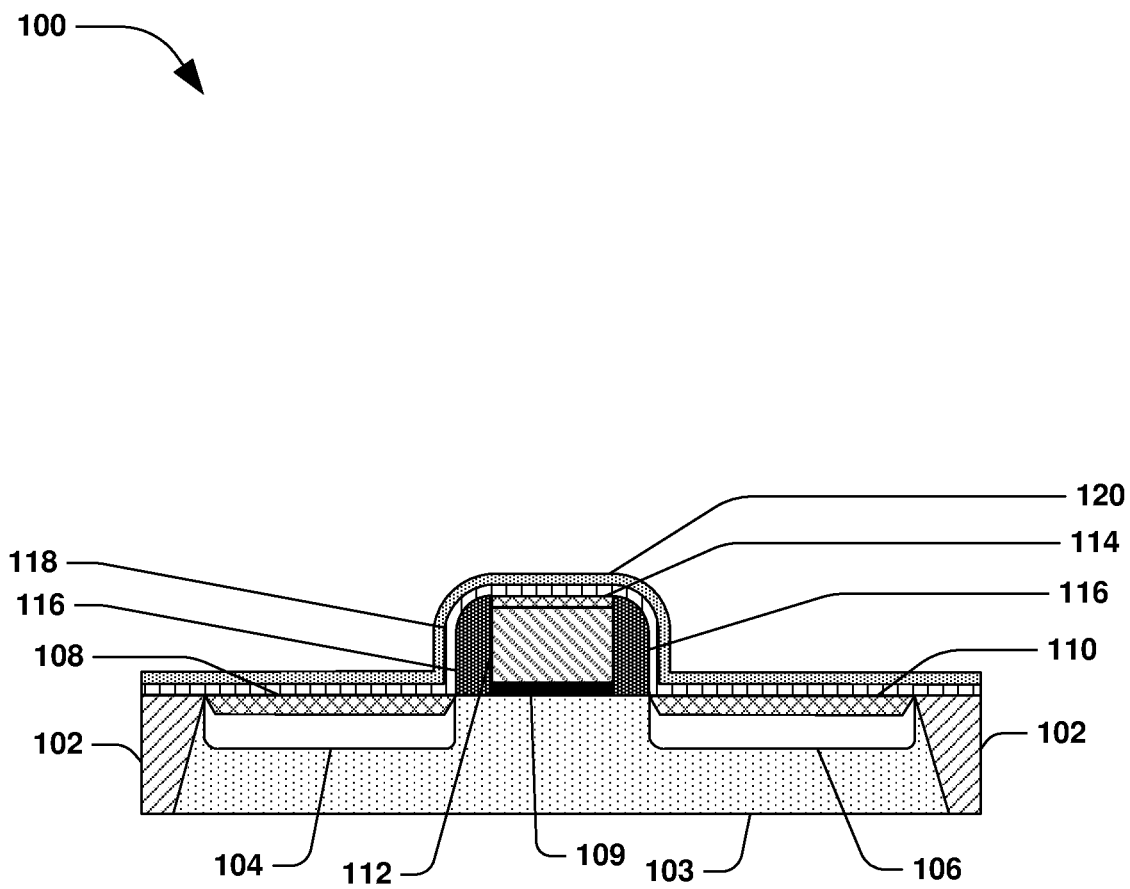
Figure 1D:
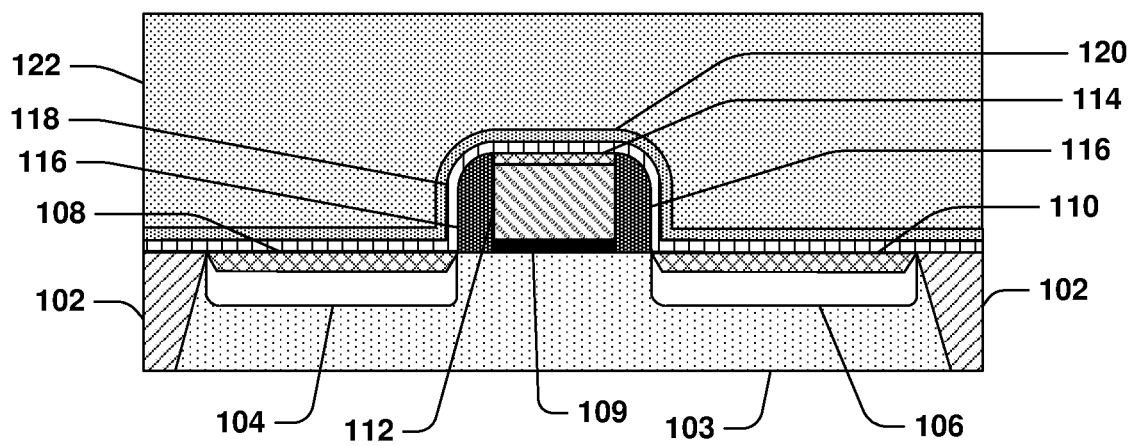
Figure 1E:
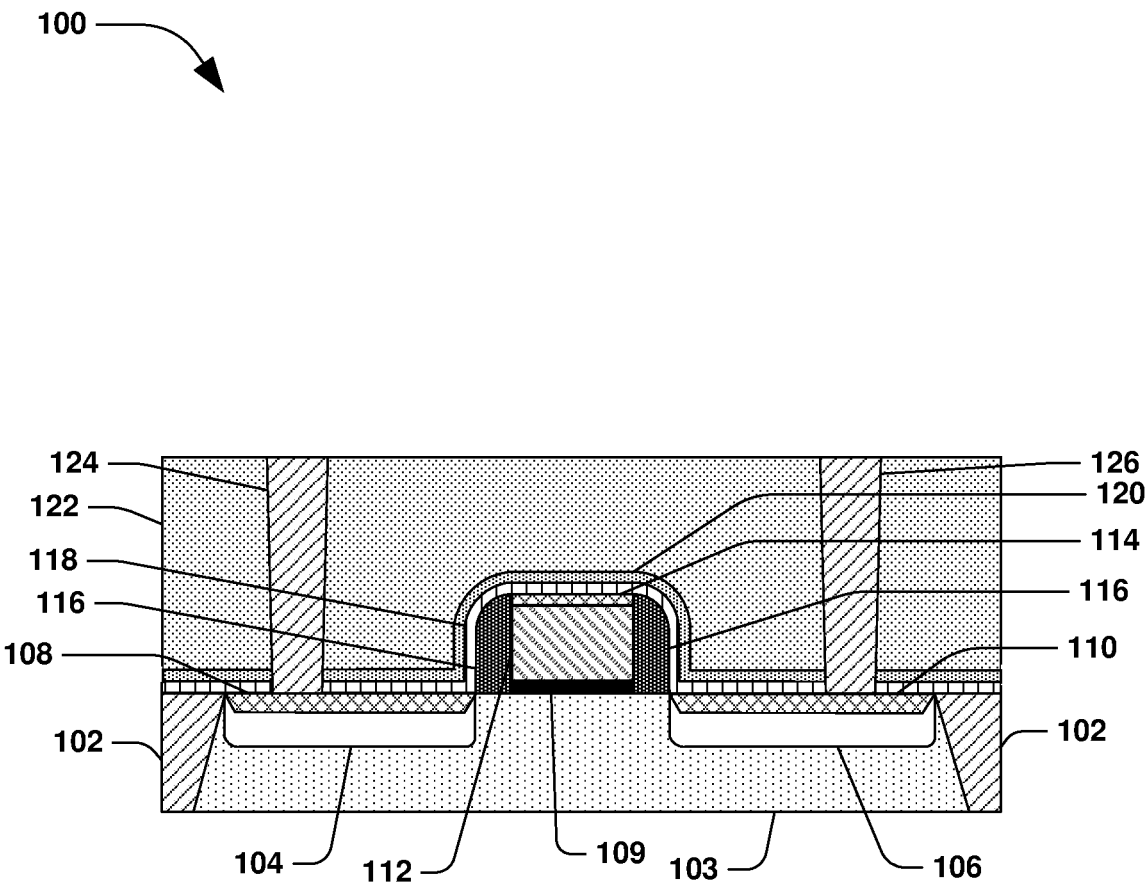
Figure 1F:
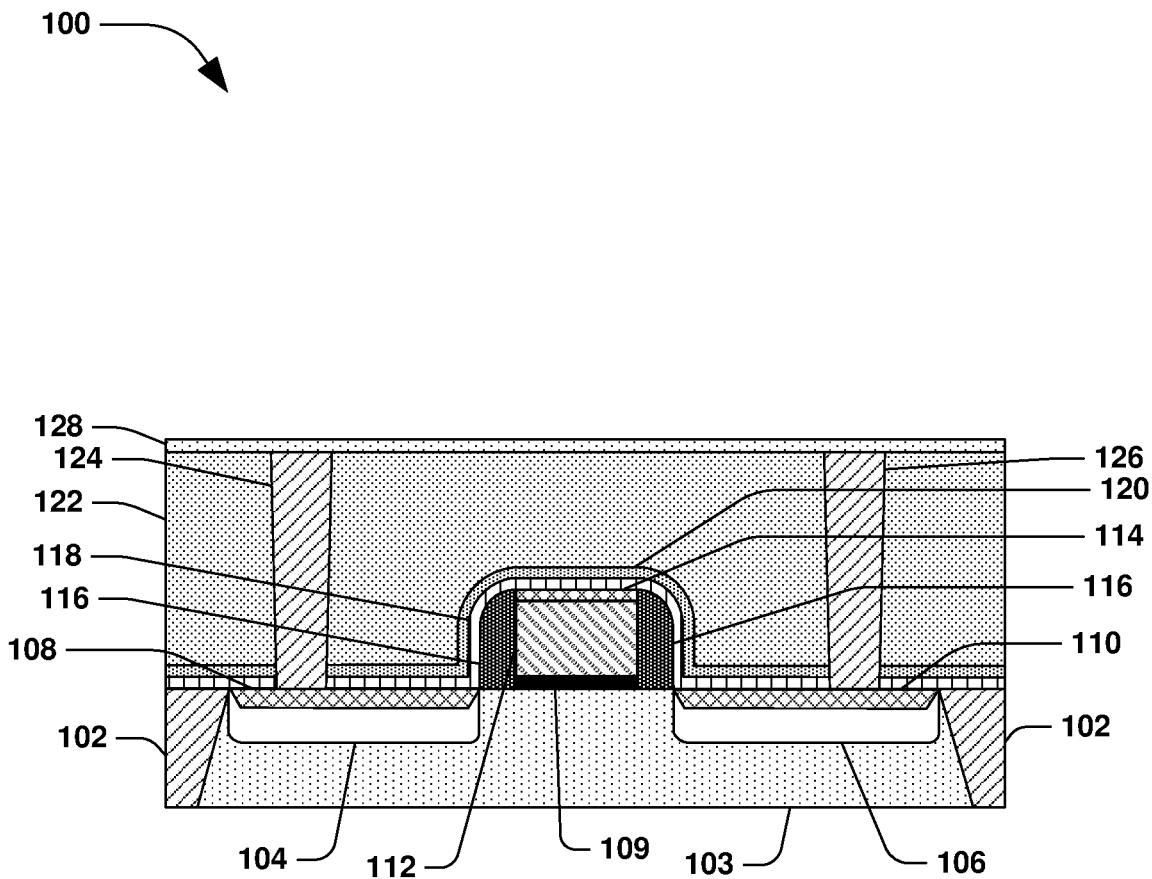
Figure 1G:
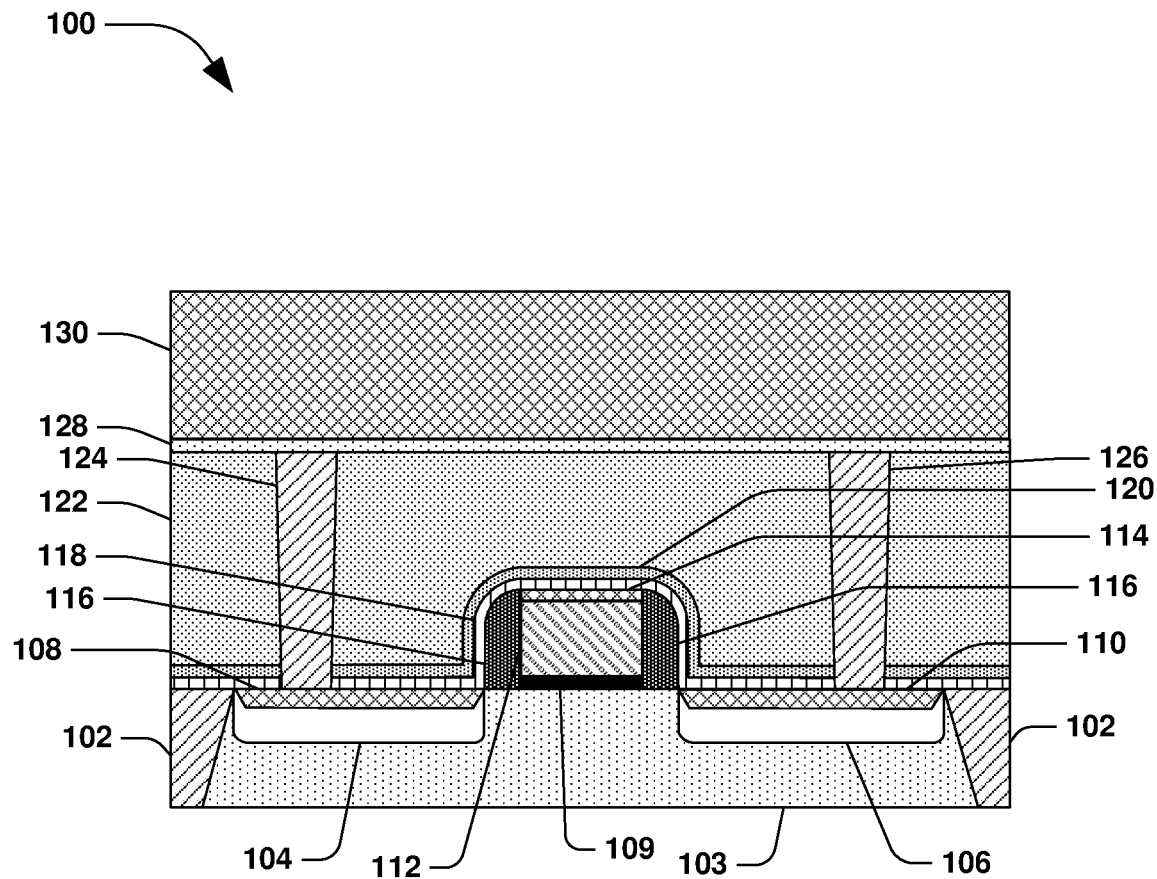
Figure 1H:
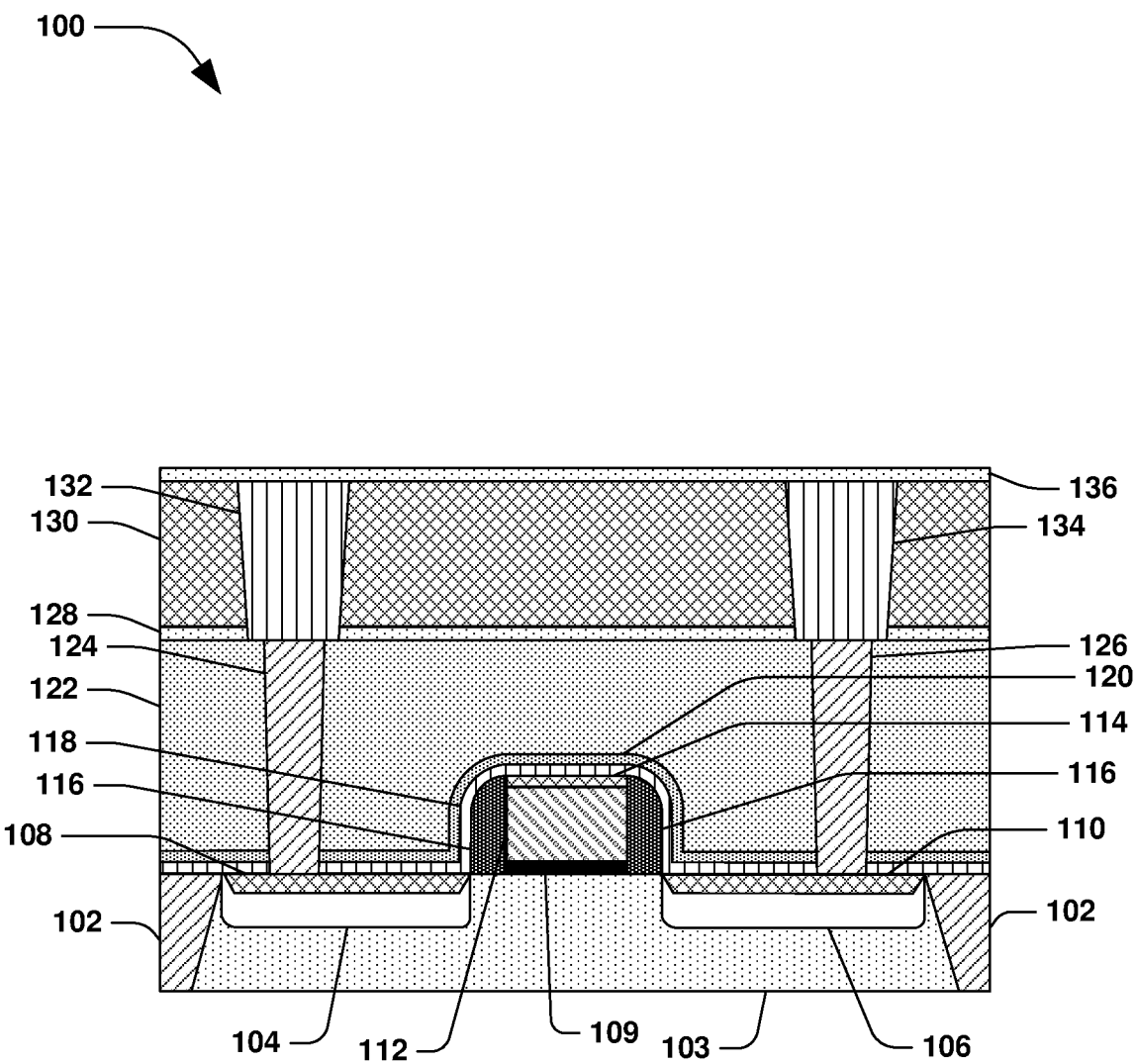
Figure 1I:
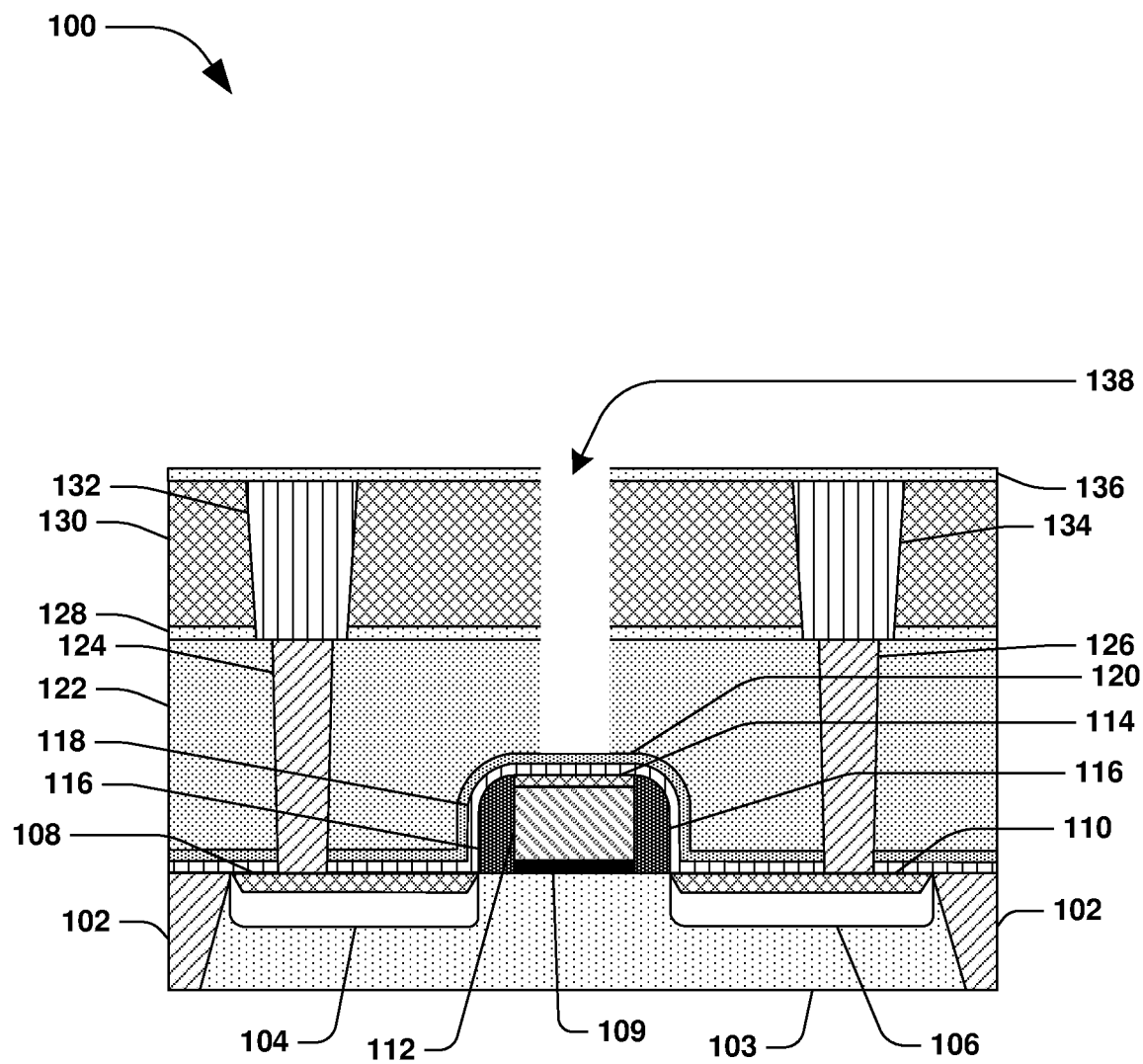
Figure 1J:
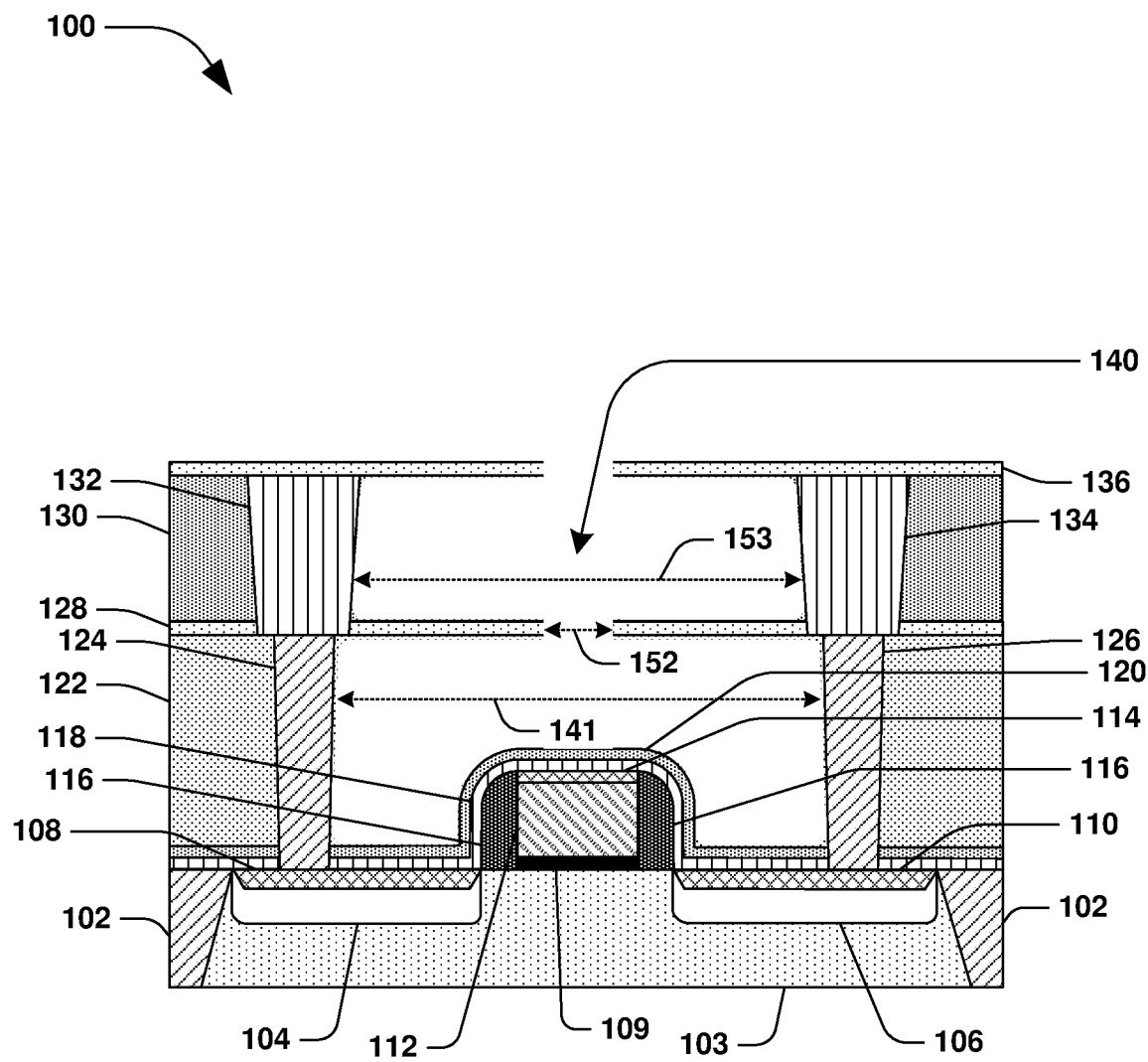
Figure 2:
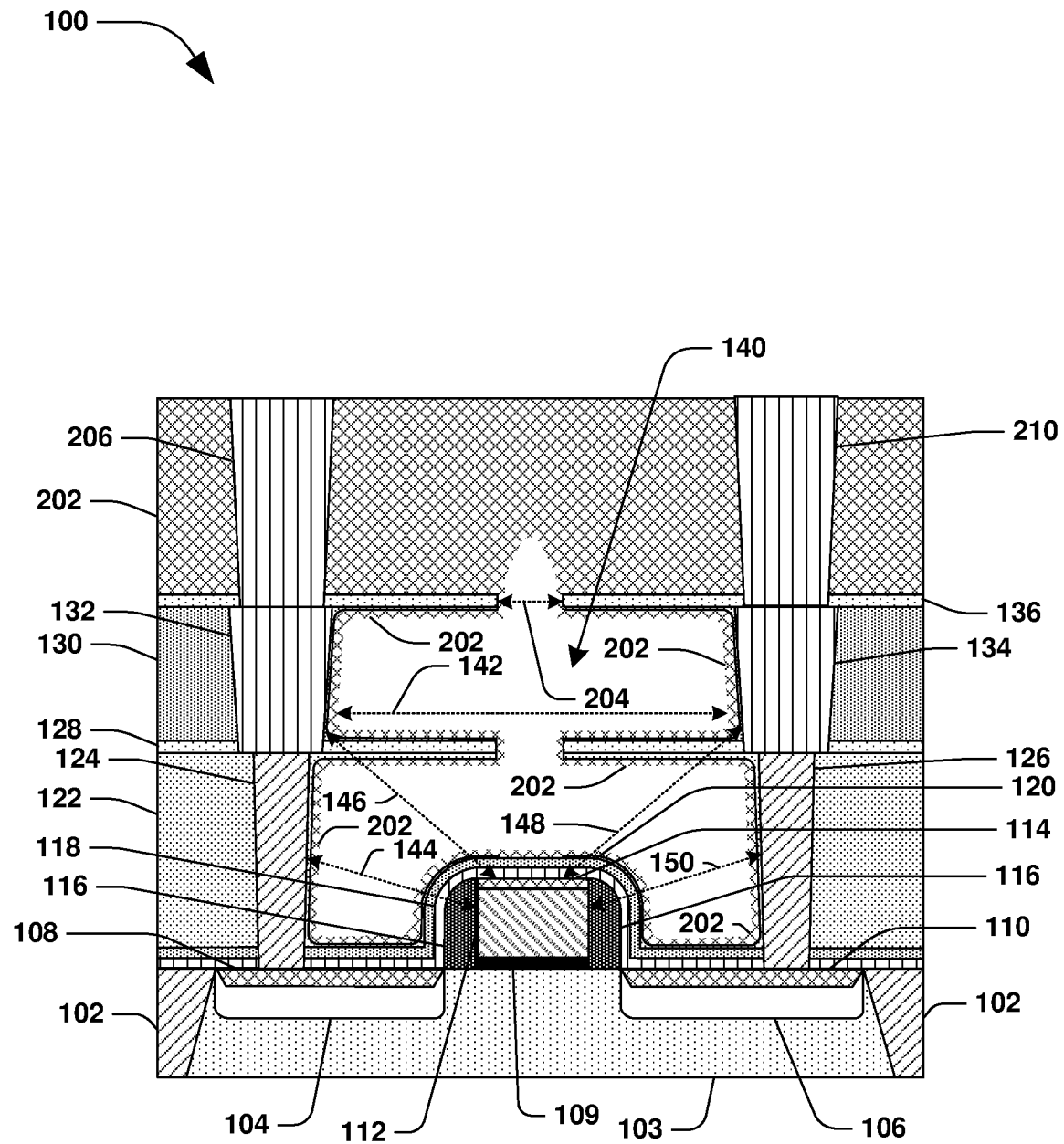

FIGS. 1A-2 are cross-sectional views of a semiconductor arrangement formed with an airgap in accordance with some embodiments. Referring to FIG. 1A, a semiconductor arrangement 100 comprising a first source/drain region 104, a second source/drain region 106, and a gate structure 101 disposed over a substrate 103 is provided. The first source/drain region 104, the second source/drain region 106, and the gate structure 101 are disposed between isolation structures 102, such as shallow trench isolation (STI) structures. In some embodiments, a first silicide 108 is disposed over the first source/drain region 104. In some embodiments, a second silicide 110 is disposed over the second source/drain region 106. In some embodiments, the first silicide 108 and the second silicide 110 comprise nickel silicide (NiSi) or other suitable material.

In some embodiments, the gate structure 101 comprises a gate dielectric layer 109, a gate electrode 112, and a cap layer 114. In some embodiments, the gate dielectric layer 109 comprises a high-k dielectric material. As used herein, the term "high-k dielectric" refers to the material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3, and each value of y is independently from 0 to 2.

In some embodiments, the gate electrode comprises polysilicon, metal, or other suitable materials. In some embodiments, the cap layer 114 comprises nickel silicide (NiSi) or other suitable material. In some embodiments, sidewall spacers 116 of the gate structure 101 are formed adjacent sidewalls of at least one of the gate dielectric layer 109, the gate electrode 112, or the cap layer 114.

Referring to FIG. 1B, a first etch stop layer (ESL) 118 is formed over at least one of the isolation structures 102, the first silicide 108, the second silicide 110, the sidewall spacers 116, or the cap layer 114 of the semiconductor arrangement 100, in accordance with some embodiments. In some embodiments, the first etch stop layer 118 is formed conformally over the at least one of the isolation structures 102, the first silicide 108, the second silicide 110, the sidewall spacers 116, or the cap layer 114, such that the first etch stop layer 118 has a substantially uniform thickness. In some embodiments, the first etch stop layer 118 is formed non-conformally over the at least one of the isolation structures 102, the first silicide 108, the second silicide 110, the sidewall spacers 116, or the cap layer 114, such that the first etch stop layer 118 has a non-uniform thickness In some embodiments, the first etch stop layer 118 comprises a silicon nitride (SiN) or other suitable material. In some embodiments, the first etch stop layer 118 is formed by a deposition process, such as chemical vapor deposition (CVD), physical vapor deposition (PVD), plasma enhanced chemical vapor deposition (PECVD), atomic layer CVD (ALCVD), atomic layer deposition (ALD), a spin-on technology, or other suitable deposition process. In some embodiments, such as where the first silicide 108 and second silicide 110 are not formed, the first etch stop layer 118 is formed over and contacts the first source/drain region 104 and the second source/drain region 106.

Referring to FIG. 1C, a protection layer 120 is formed over the first etch stop layer 118 of the semiconductor arrangement 100, in accordance with some embodiments. In some embodiments, the protection layer 120 is formed conformally over the first etch stop layer 118. In some embodiments, the protection layer 120 is formed non-conformally over the first etch stop layer 118

In some embodiments, the protection layer 120 comprises silicon carbide (SiC) or other suitable material. In some embodiments, the protection layer 120 comprises a plurality of dielectric layers. For example, the protection layer 120 may comprise a silicon carbide layer, a silicon oxide layer over the silicon carbide layer, and a second silicon carbide layer over the silicon oxide layer. In some embodiments, the protection layer 120 is formed by a deposition process, such as CVD, PVD, PECVD, ALCVD, ALD, a spin-on technology, or other suitable deposition process. In some embodiments, the protection layer 120 has a thickness in a range from about 100 angstroms to about 1,000 angstroms. In some embodiments, the protection layer 120 generates stress, such as tensile strain or compressive strain, in a channel region between the first source/drain region 104 and the second source/drain region 106 that enhances electron carrier mobility of electrons through the channel region.

In some embodiments, the first etch stop layer 118 is not formed within the semiconductor arrangement 100. In such embodiments, the protection layer 120 may be formed directly over at least one of the isolation structures 102, the first silicide 108, the second silicide 110, the sidewall spacers 116, or the cap layer 114, for example.

Referring to FIG. 1D, a first dielectric layer 122 is formed over the protection layer 120, in accordance with some embodiments. In some embodiments, the first dielectric layer 122 comprises a low-k dielectric material. Low-k dielectric materials have a k-value (dielectric constant) lower than about 3.9. Some low-k dielectric materials have a k-value lower than about 3.5 and may have a k-value lower than about 2.5. In some embodiments, the first dielectric layer 122 comprise at least one of Si, O, C, or H, such as SiCOH and SiOC, or other suitable materials. In some embodiments, organic materials such as polymers are used for the first dielectric layer 122. In some embodiments, the first dielectric layer 122 comprises one or more layers of a carbon-containing material, organo-silicate glass, a porogen-containing material, or combinations thereof. In some embodiments, the first dielectric layer 122 comprises nitrogen. In some embodiments, the first dielectric layer 122 is formed by using, for example, at least one of CVD, PVD, PECVD, ALCVD, ALD, a spin-on technology, or other suitable deposition process.

Referring to FIG. 1E, the first dielectric layer 122, the protection layer 120, and the first etch stop layer 118 are etched to define a first recess, and a first contact 124 is formed in the first recess, in accordance with some embodiments. In some embodiments, the first dielectric layer 122, the protection layer 120, and the first etch stop layer 118 are etched to also define a second recess, and a second contact 126 is formed in the second recess. In some embodiments, the first dielectric layer 122, the protection layer 120, and the first etch stop layer 118 are etched using a single damascene process or a multi-damascene, such as dual damascene process, to define the first recess and the second recess. In some embodiments, the first contact 124 and the second contact 126 are formed by a deposition process, such as CVD, PVD, PECVD, ALCVD, ALD, a spin-on technology, or other suitable deposition process. In some embodiments, a chemical-mechanical planarization (CMP) process is performed after the deposition process to remove excess material deposited during the deposition process.

In some embodiments, the first contact 124 is formed over the first source/drain region 104 and is in contact with the first silicide 108. In this way, the first contact 124 provides electrical connectivity to the first source/drain region 104. In some embodiments, the first contact 124 is formed to be in contact with the first etch stop layer 118 and the protection layer 120. In some embodiments, the second contact 126 is formed over the second source/drain region 106 and is in contact with the second silicide 110. In this way, the second contact 126 provides electrical connectivity to the second source/drain region 106. In some embodiments, the second contact 126 is formed to be in contact with the first etch stop layer 118 and the protection layer 120. In some embodiments, the first contact 124 and the second contact 126 comprise a conductive material, such as copper or other suitable material.

Referring to FIG. 1F, a second etch stop layer 128 is formed over the first dielectric layer 122 of the semiconductor arrangement 100, in accordance with some embodiments. In some embodiments, the second etch stop layer 128 is formed over the first contact 124 and the second contact 126 of the semiconductor arrangement 100. In some embodiments, the second etch stop layer 128 is formed by a deposition process, such as CVD, PVD, PECVD, ALCVD, ALD, a spin-on technology, or other suitable deposition process.

In some embodiments, the second etch stop layer 128 comprises a silicon nitride (SiN), silicon carbide (SiC), or other suitable material. In some embodiments, the second etch stop layer 128 comprises a same material composition as the first etch stop layer 118. In some embodiments, the second etch stop layer 128 comprises a same material composition as the protection layer 120. In some embodiments, a material composition of the second etch stop layer 128 is different than a material composition of the first etch stop layer 118 and is different than a material composition of the protection layer 120.

Referring to FIG. 1G, a second dielectric layer 130 is formed over the second etch stop layer 128, in accordance with some embodiments. In some embodiments, the second dielectric layer 130 is formed by a deposition process, such as CVD, PVD, PECVD, ALCVD, ALD, a spin-on technology, or other suitable deposition process.

In some embodiments, the second dielectric layer 130 comprises a low-k dielectric material. In some embodiments, the first dielectric layer 122 and the second dielectric layer 130 comprise a same material composition. In some embodiments, the first dielectric layer 122 comprises a first material composition and the second dielectric layer 130 comprises a second material composition different than the first material composition.

Referring to FIG. 1H, the second dielectric layer 130 and the second etch stop layer 128 are etched to define a third recess and a first metal structure 132 is formed within the third recess, in accordance with some embodiments. In some embodiments, the second dielectric layer 130 and the second etch stop layer 128 are also etched to define a fourth recess and a second metal structure 134 is formed within the fourth recess. In some embodiments, the second dielectric layer 130 and the second etch stop layer 128 are etched using a single damascene process or a multi-damascene, such as dual damascene process, to define the third recess and the fourth recess. In some embodiments, the first metal structure 132 and the second metal structure 134 are formed by a deposition process, such as CVD, PVD, PECVD, ALCVD, ALD, a spin-on technology, or other suitable deposition process. In some embodiments, a CMP process is performed after the deposition process to remove excess material deposited during the deposition process.

In some embodiments, the first contact 124 is exposed through the third recess during the etching of the second dielectric layer 130 and the second etch stop layer 128, and the first metal structure 132 is formed to contact the first contact 124. In some embodiments, the second contact 126 is exposed through the fourth recess during the etching of the second dielectric layer 130 and the second etch stop layer 128, and the second metal structure 134 is formed to contact the second contact 126.

In some embodiments, the first metal structure 132 and the second metal structure 134 are metal lines within a metal one (M1) back end of line (BEOL) layer of the semiconductor arrangement 100. In some embodiments, the first metal structure 132 and the second metal structure 134 comprise a conductive material, such as copper or other suitable material.

In some embodiments, a third etch stop layer 136 is formed over the second dielectric layer 130 of the semiconductor arrangement 100 after the first metal structure 132 and the second metal structure 134 are formed. In some embodiments, the third etch stop layer 136 is formed over the first metal structure 132 and the second metal structure 134. In some embodiments, the third etch stop layer 136 comprises a silicon nitride (SiN), silicon carbide (SiC), or other suitable material.

While in the illustrated embodiments, the third etch stop layer 136 is formed over the first metal structure 132 and the second metal structure 134, in some embodiments, the third etch stop layer 136 is formed laterally adjacent the first metal structure 132 and the second metal structure 134. For example, in some embodiments, the second dielectric layer 130 is recessed to expose a portion of a sidewall of the first metal structure 132 and a portion of the sidewall of the second metal structure 134, and the third etch stop layer 136 is formed in the recess to contact the portion of the sidewall of the first metal structure 132 and the portion of the sidewall of the second metal structure 134 (not shown).

Referring to FIG. 1I, a first etch process is performed through at least one of the third etch stop layer 136, the second dielectric layer 130, the second etch stop layer 128, and the first dielectric layer 122 of the semiconductor arrangement 100, in accordance with some embodiments. In some embodiments, the first etch process forms a cavity 138 over the gate structure 101. In some embodiments, the first etch process forms the cavity 138 between the first contact 124 and the second contact 126. In some embodiments, the first etch process forms the cavity 138 between the first metal structure 132 and the second metal structure 134. In some embodiments, the first etch process etches to and exposes a first portion of the protection layer 120, as illustrated in FIG. 1I. In some embodiments, the first etch process is terminated before the protection layer 120 is exposed, and thus a portion of the first dielectric layer 122 remains between a bottom of the cavity 138 and the protection layer 120. In an embodiment, the first etch process comprises a dry etch process, such as a plasma etch or other suitable etch.

In the illustrated embodiment, the cavity 138 is defined by substantially vertical sidewalls of the first dielectric layer 122, the second etch stop layer 128, the second dielectric layer 130, and the third etch stop layer 136. However, other shapes for the cavity 138 are contemplated. Thus, the cavity 138 need not be defined by substantially vertical sidewalls of the first dielectric layer 122, the second etch stop layer 128, the second dielectric layer 130, and the third etch stop layer 136, but rather can be defined by tapered or curved sidewalls, for example, of at least one of the first dielectric layer 122, the second etch stop layer 128, the second dielectric layer 130, or the third etch stop layer 136, for example.

Referring to FIG. 1J, a second etch process is performed through the cavity 138 to create an airgap 140 within the semiconductor arrangement 100, in accordance with some embodiments. In some embodiments, the second etch process is performed to remove a portion of the first dielectric layer 122 between the first contact 124 and the second contact 126. In some embodiments, the second etch process is performed to remove a portion of the second dielectric layer 130 between the first metal structure 132 and the second metal structure 134. In some embodiments, the second etch process exposes a second portion of the protection layer. In some embodiments, the second etch process exposes a sidewall of at least one of the first contact 124 or the second contact 126.

In some embodiments, the second etch process can be performed to create various shapes and sizes of airgaps within the semiconductor arrangement 100, which will be later described in connection with FIGS. 2-7. The airgap 140 can comprise any shape or size, and thus can be formed to be smaller, larger, or a different shape than what is depicted in FIG. 1J. In some embodiments, the second etch process comprises a wet etch process, such as a chemical etch, or a combination of a dry etch process and a wet etch process. In some embodiments, the protection layer 120 protects structures and layers underlying the protection layer 120 from being damaged by the second etch process. In some embodiments, the protection layer 120 stops the second etch process from etching the first etch stop layer 118 and the gate structure 101, and thus protects such devices and layers of the semiconductor arrangement 100.

In some embodiments, at least a portion of the first dielectric layer 122 between the first contact 124 and the second contact 126 remains after the second etch process.

For example, a portion of the first dielectric layer 122 adjacent at least one of a sidewall of the first contact 124, a sidewall of the second contact 126, a top surface of the protection layer 120, or a bottom surface of the second etch stop layer 128 may remain after the second etch process. In some embodiments, at least a portion of the second dielectric layer 130 between the first metal structure 132 and the second metal structure 134 remains after the second etch process. For example, a portion of the second dielectric layer 130 adjacent at least one of a sidewall of the first metal structure 132, a sidewall of the second metal structure 134, a top surface of the second etch stop layer 128, or a bottom surface of the third etch stop layer 136 may remain after the second etch process.

Moreover, while the illustrated embodiment provides that the first etch process and second etch process are performed after the formation of the third etch stop layer 136, in some embodiments, the first etch process and the second etch process are performed before the third etch stop layer 136 is formed. Thus, in some embodiments, the first etch process and second etch process are performed while a top surface of the second dielectric layer 130 is exposed.

In some embodiments, a width, or critical dimension (CD), of the airgap 140 is non-uniform. For example, the width of the airgap 140 may decrease moving in a direction from the substrate 103 toward the third etch stop layer 136. Moreover, in some embodiments, the width of the airgap 140 may vary between layers in which the airgap 140 is formed. For example, the width 141 of the airgap 140 formed in the first dielectric layer 122 may be greater than the width 152 of the airgap 140 formed in the second etch stop layer 128. Thus, the width 141 of the airgap 140 below the second etch stop layer 128 may be greater than the width 152 of the airgap 140 adjacent the second etch stop layer 128. As another example, the width 153 of the airgap 140 formed in the second dielectric layer 130 may be greater than the width 152 of the airgap 140 formed in the second etch stop layer 128. Thus, the width 153 of the airgap 140 above the second etch stop layer 128 may be greater than the width 152 of the airgap 140 adjacent the second etch stop layer 128.

Referring to FIG. 2, a third dielectric layer 202 is formed over the third etch stop layer 136 after the airgap 140 has been formed, in accordance with some embodiments. In some embodiments, a deposition process, such as a PVD process is performed to form the third dielectric layer 202. In some embodiments, due to at least one of the size or width 204 of the opening or properties of materials being used to form the third dielectric layer 202 in the third etch stop layer 136, the third dielectric layer 202 pinches off during the deposition process, resulting in the airgap 140 being closed or sealed prior to the dielectric material of the third dielectric layer 202 filling the airgap 140. In some embodiment, the third dielectric layer 202 seals the airgap 140 and trap gases comprised within the airgap 140. In some embodiments, during the deposition process, such as during the PVD process, and prior to the third dielectric layer 202 pinching off, a portion of the third dielectric layer 202 is deposited in the airgap 140 and attaches to one or more of the layers defining the airgap 140. For example, portions of the third dielectric layer 202 may attach to at least one of a sidewall of the first metal structure 132, a sidewall of second metal structure 134, a sidewall of the second dielectric layer 130 if a portion of the second dielectric layer 130 remains present between the airgap 140 and the first metal structure 132 or second metal structure 134, a sidewall of the first contact 124, a sidewall of the second contact 126, a surface of the first dielectric layer 122 if the first dielectric layer 122 remains present between the airgap 140 and at least one of the first contact 124, the second contact 126 or the protection layer 120, a top surface of the protection layer 120, a bottom surface of the second etch stop layer 128, a top surface of the second etch stop layer 128, or a bottom surface of the third etch stop layer 136. In such embodiments, the thickness of the portion of the third dielectric layer 202 may vary within the airgap 140. Thus, the third dielectric layer 202 may not be uniformly deposited in the airgap 140.

In some embodiments, a dielectric material of the third dielectric layer 202 is the same as the dielectric material of the first dielectric layer 122. In some embodiments, the dielectric material of the third dielectric layer 202 is the same as the dielectric material of the second dielectric layer 130. In some embodiments, the dielectric material of the third dielectric layer 202 is different than the dielectric material of the first dielectric layer 122. In some embodiments, the dielectric material of the third dielectric layer 202 is different than the dielectric material of the second dielectric layer 130.

In some embodiments, such as where a remnant of the first dielectric layer 122 remains between the airgap 140 and at least one of the first contact 124, the second contact 126, the protection layer 120, or the second etch stop layer 128, the third dielectric layer 202 may be formed over the remnant of the first dielectric layer 122 such that the remnant of the first dielectric layer 122 separates the at least one of the first contact 124, the second contact 126, the protection layer 120, or the second etch stop layer 128 from the third dielectric layer 202. In some embodiments, such as where a remnant of the second dielectric layer 130 remains between the airgap 140 and at least one of the first metal structure 132, the second metal structure 134, the second etch stop layer 128, or the third etch stop layer 136, the third dielectric layer 202 may be formed over the remnant of the second dielectric layer 130 such that the remnant of the second dielectric layer 130 separates the at least one of the first metal structure 132, the second metal structure 134, the second etch stop layer 128, or the third etch stop layer 136 from the third dielectric layer 202.

In some embodiments, the third dielectric layer 202 and the third etch stop layer 136 are etched to define a fifth recess and a third metal structure 206 is formed within the fifth recess, in accordance with some embodiments. In some embodiments, the first metal structure 132 is exposed through the fifth recess and the third metal structure 206 is formed to contact the first metal structure 132. In some embodiments, the third dielectric layer 202 and the third etch stop layer 136 are also etched to define a sixth recess and a fourth metal structure 210 is formed within the sixth recess. In some embodiments, the second metal structure 134 is exposed through the sixth recess and the fourth metal structure 210 is formed to contact the second metal structure 134.

In some embodiments, the third dielectric layer 202 and the third etch stop layer 136 are etched using a single damascene process or a multi-damascene, such as dual damascene process, to define the fifth recess and the sixth recess. In some embodiments, the third metal structure 206 and the fourth metal structure 210 are formed by a deposition process, such as CVD, PVD, PECVD, ALCVD, ALD, a spin-on technology, or other suitable deposition process. In some embodiments, a CMP process is performed after the deposition process to remove excess material deposited during the deposition process.

In some embodiments, the third metal structure 206 and the fourth metal structure 210 are at least one of vias or metal lines within a metal two (M2) back end of line (BEOL) layer. In some embodiments, the third metal structure 206 and the fourth metal structure 210 comprise a conductive material, such as copper or other suitable material. In some embodiments, the third metal structure 206 and the fourth metal structure 210 have a same material composition as the first metal structure 132 and the second metal structure 134. In some embodiments, a material composition of the third metal structure 206 and the fourth metal structure 210 is different than a material composition of the first metal structure 132 and the second metal structure 134.

In some embodiments, the airgap 140 is formed to replace at least some dielectric material of the first dielectric layer 122 between the first contact 124 and the second contact 126 and over the gate structure 101. In some embodiments, the airgap 140 comprises air or other suitable gases, which may have a lower dielectric constant than the dielectric constant of the first dielectric layer 122. Capacitance between two elements is a function of a dielectric constant of a material separating the two elements, and thus a lower dielectric constant of the material separating the two elements will result in a lower capacitance between the two elements.

In some embodiments, the removal of a portion of the first dielectric layer 122 and formation of the airgap 140 will reduce wiring capacitances within the semiconductor arrangement 100. In some embodiments, a first-contact-to-gate capacitance 144 between the first contact 124 and the gate structure 101 when the airgap 140 is present between the first contact 124 and the gate structure 101 will be lower than the first-contact-to-gate capacitance 144 between the first contact 124 and the gate structure 101 when the airgap 140 is not present between the first contact 124 and the gate structure 101 and instead the first dielectric layer 122 fills the space between the first contact 124 and the gate structure 101. In some embodiments, a second-contact-to-gate capacitance 150 between the second contact 126 and the gate structure 101 when the airgap 140 is present between the second contact 126 and the gate structure 101 will be lower than the second-contact-to-gate capacitance 150 between the second contact 126 and the gate structure 101 when the airgap 140 is not present between the second contact 126 and the gate structure 101 and instead the first dielectric layer 122 fills the space between the second contact 126 and the gate structure 101.

In some embodiments, a first-metal-structure-to-gate capacitance 146 between the first metal structure 132 and the gate structure 101 when the airgap 140 is present between the first metal structure 132 and the gate structure 101 will be lower than the first-metal-structure-to-gate capacitance 146 between the first metal structure 132 and the gate structure 101 when the airgap 140 is not present between the first metal structure 132 and the gate structure 101 and instead the first dielectric layer 122 fills the space between the first metal structure 132 and the gate structure 101. In some embodiments, a second-metal-structure-to-gate capacitance 148 between the second metal structure 134 and the gate structure 101 when the airgap 140 is present between the second metal structure 134 and the gate structure 101 will be lower than the second-metal-structure-to-gate capacitance 148 between the second metal structure 134 and the gate structure 101 when the airgap 140 is not present between the second metal structure 134 and the gate structure 101 and instead the first dielectric layer 122 fills the space between the second metal structure 134 and the gate structure 101.

In some embodiments, the airgap 140 is formed to replace at least some of the dielectric material of the second dielectric layer 130 between the first metal structure 132 and the second metal structure 134 of the semiconductor arrangement 100. In some embodiments, a metal-structure-to-metal-structure capacitance 142 between the first metal structure 132 and the second metal structure 134 when the airgap 140 is present between the first metal structure 132 and the second metal structure 134 will be lower than the metal-structure-to-metal-structure capacitance 142 between the first metal structure 132 and the second metal structure 134 when the airgap 140 is not present between the first metal structure 132 and the second metal structure 134 and instead the second dielectric layer 130 fills the space between the first metal structure 132 and the second metal structure 134.

An off-state capacitance of the semiconductor arrangement 100 is a function of the wiring capacitance and a device capacitance of the semiconductor arrangement 100. In some embodiments, the device capacitance is a function of at least one of a gate-to-source/drain capacitance between the gate structure 101 and the first source/drain region 104, a gate-to-source/drain capacitance between the gate structure 101 and the second source/drain region 106, a source/drain-to-substrate capacitance between the first source/drain region 104 and the substrate 103 of the semiconductor arrangement 100, or a source/drain-to-substrate capacitance between the second source/drain region 106 and the substrate 103 of the semiconductor arrangement 100. In some embodiments, the wiring capacitance is a function of at least one of the first-contact-to-gate capacitance 144, the second-contact-to-gate capacitance 150, the first-metal-structure-to-gate capacitance 146, the second-metal-structure-to-gate capacitance 148, or the metal-structure-to-metal-structure capacitance 142.

Because the airgap 140 reduces the wiring capacitance of the semiconductor arrangement 100, the off-state capacitance of the semiconductor arrangement 100 is reduced. In some embodiments, reducing the off-state capacitance of the semiconductor arrangement 100 will reduce a time delay of the semiconductor arrangement 100, such as a resistance-capacitance (RC) time delay of the semiconductor arrangement 100. In some embodiments, reducing the off-state capacitance of the semiconductor arrangement 100 will improve switch functionality of the semiconductor arrangement 100, such as radio frequency (RF) switching of the semiconductor arrangement 100. Many radio frequency front end modules (RF-FEM) require low off-state capacitance, and thus the airgap 140 will reduce the off-state capacitance of the semiconductor arrangement 100 so that the semiconductor arrangement 100 can be used for radio frequency front end modules and will provide improved high frequency features for the radio frequency front end modules, for example.

In some embodiments where the airgap 140 is formed between the first metal structure 132 and the second metal structure 134, between the first contact 124 and the gate structure 101 and between the second contact 126 and the gate structure 101, as illustrated by FIG. 2, the off-state capacitance is reduced by about 40% or more. This is because about 45% or more of the off-state capacitance of the semiconductor arrangement 100 is from the wiring capacitances between the first metal structure 132 and the second metal structure 134, between the first contact 124 and the gate structure 101, between the second contact 126 and the gate structure 101, between the first metal structure 132 and the gate structure 101, and between the second metal structure 134 and the gate structure 101.

Figure 3:
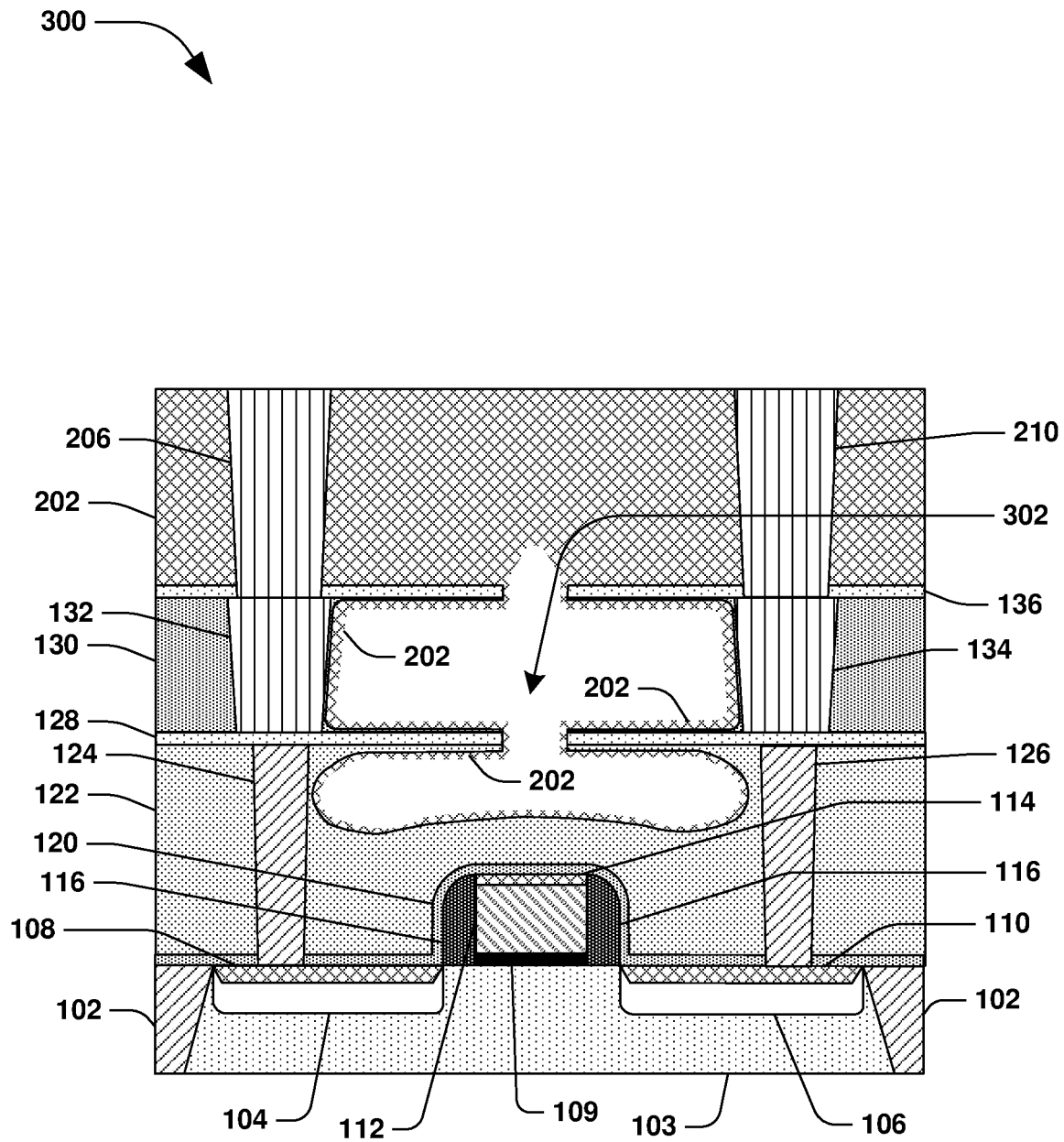
FIG. 3 is an illustration of a cross-sectional view of a semiconductor arrangement comprising an airgap, in accordance with some embodiments.

FIG. 3 is a cross-sectional view of a semiconductor arrangement 300 formed with an airgap 302, in accordance with some embodiments. The semiconductor arrangement 300 differs from the semiconductor arrangement 100 illustrated in FIGS. 1A-2 in that the airgap 302 is separated from the protection layer 120 by the first dielectric layer 122. In some embodiments, to form the semiconductor arrangement 300, when performing the first etch process, as described with respect to FIG. 1I, the cavity 138 is formed to extend merely through a portion, such as a top half, of the first dielectric layer 122, and the protection layer 120 remains concealed by the first dielectric layer 122. The semiconductor arrangement 300 also differs from the semiconductor arrangement 100 illustrated in FIGS. 1A-2 in that the first etch stop layer 118 is not present. Thus, the protection layer 120 is formed to contact the isolation structures 102, the first silicide 108, the sidewall spacers 116, the cap layer 114, and the second silicide 110.

Figure 4:
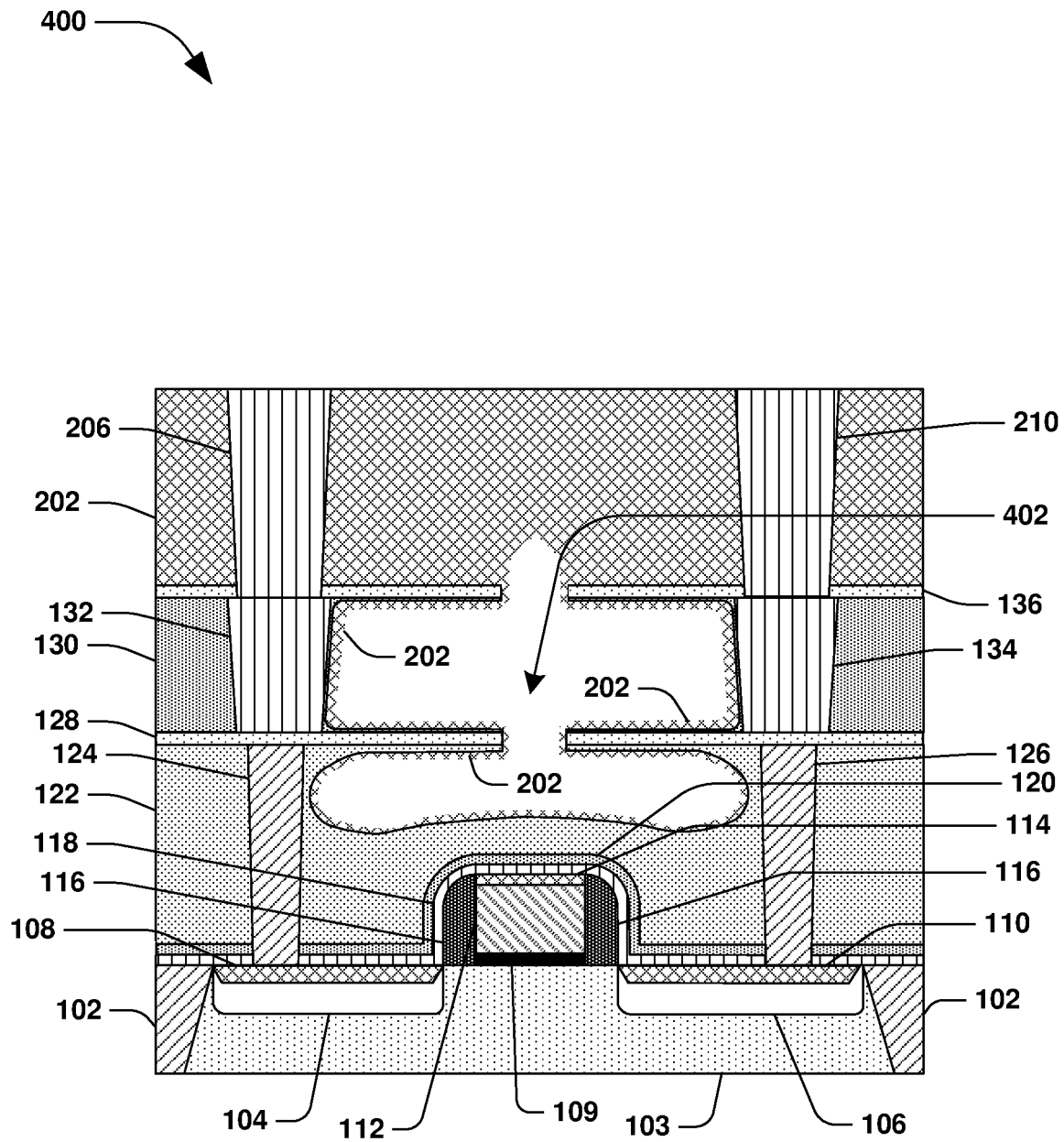
FIG. 4 is an illustration of a cross-sectional view of a semiconductor arrangement comprising an airgap, in accordance with some embodiments.

FIG. 4 is a cross-sectional view of a semiconductor arrangement 400 formed with an airgap 402, in accordance with some embodiments. The semiconductor arrangement 400 differs from the semiconductor arrangement 300 illustrated in FIG. 3 in that the protection layer 120 is formed over the first etch stop layer 118.

Figure 5:
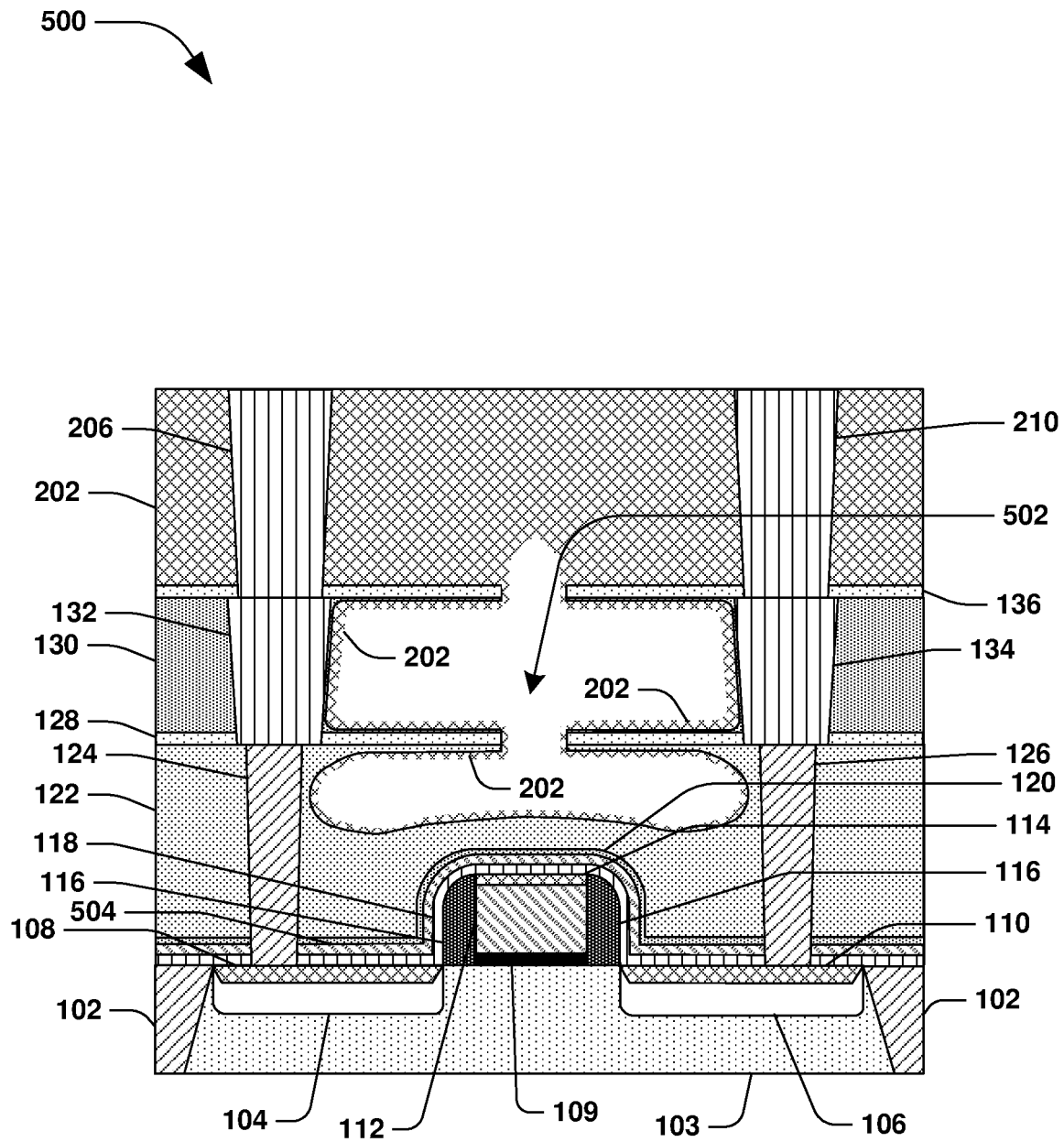
FIG. 5 is an illustration of a cross-sectional view of a semiconductor arrangement comprising an airgap, in accordance with some embodiments.

FIG. 5 is a cross-sectional view of a semiconductor arrangement 500 formed with an airgap 502, in accordance with some embodiments. The semiconductor arrangement 500 differs from the semiconductor arrangement 400 illustrated in FIG. 4 in that an oxide layer 504 is disposed between the first etch stop layer 118 and the protection layer 120. In some embodiments, the oxide layer 504 comprises silicon oxide or silicon oxynitride. In some embodiments, the oxide layer 504 is formed by depositing an oxide material over the first etch stop layer 118 prior to forming the protection layer 120 using deposition process, such as CVD, PVD, PECVD, ALCVD, ALD, a spin-on technology, or other suitable deposition process. In some embodiments, the oxide layer 504 is formed from native oxide caused by the exposure of the underlying first etch stop layer 118 to oxygen.

Figure 6:
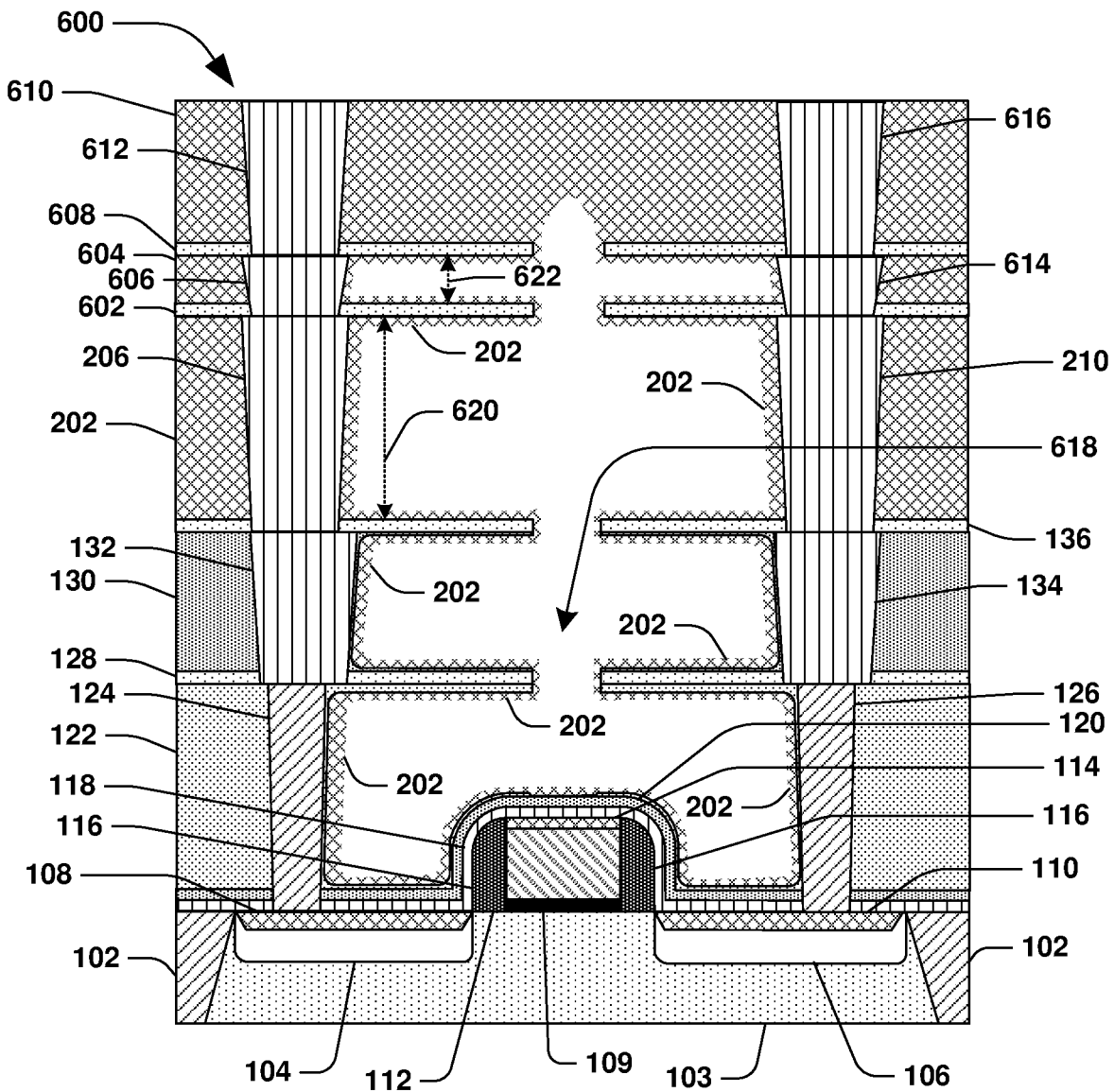
FIG. 6 is an illustration of a cross-sectional view of a semiconductor arrangement comprising an airgap, in accordance with some embodiments.

FIG. 6 is a cross-sectional view of a semiconductor arrangement 600 formed with an airgap 618 according to some embodiments. The semiconductor arrangement 600 differs from the semiconductor arrangement 100 illustrated in FIG. 2 in that a fourth etch stop layer 602, a fourth dielectric layer 604, a fifth etch stop layer 608, and a fifth dielectric layer 610 are formed over the third dielectric layer 202. Moreover, the semiconductor arrangement 600 comprises a fifth metal structure 606, a sixth metal structure 612, a seventh metal structure 614, and an eighth metal structure 616.

In some embodiments, the fourth dielectric layer 604 and the fourth etch stop layer 602 are etched to form a seventh recess in which the fifth metal structure 606 is formed and a eighth recess in which the seventh metal structure 614 is formed. In some embodiments, the fourth dielectric layer 604 and the fourth etch stop layer 602 are etched using a single damascene process or a multi-damascene, such as dual damascene process, to define the first recess and the second recess. In some embodiments, fifth metal structure 606 and the seventh metal structure 614 are formed by a deposition process, such as CVD, PVD, PECVD, ALCVD, ALD, a spin-on technology, or other suitable deposition process. In some embodiments, a chemical-mechanical planarization (CMP) process is performed after the deposition process to remove excess material deposited during the deposition process.

In some embodiments, after the fifth metal structure 606 and the seventh metal structure 614 are formed, the fifth etch stop layer 608 is formed. Then, the first etch process is performed as described with respect to FIG. 1I. In some embodiments, the first etch process etches through the fifth etch stop layer 608, the fourth dielectric layer 604, the fourth etch stop layer 602, the third dielectric layer 202, the third etch stop layer 136, the second dielectric layer 130, the second etch stop layer 128, and the first dielectric layer 122. In some embodiments, the second etch process is performed as described with respect to FIG. 1J to form the airgap 618. While the illustrated embodiments illustrate the second etch process removing substantially all of the dielectric materials between the metal structures 132, 134, 206, 210, 612, 616 and the contacts 124, 126, in some embodiments at least some dielectric material remains between at least one of the metal structures 132, 134, 206, 210, 612, 616 and the contacts 124, 126. In some embodiments, an amount of dielectric material that remains is a function of the dielectric material being removed and a height between etch stop layers 128, 136, 602, 608 or between the second etch stop layer 128 and the protection layer 120. For example, an amount of the dielectric layer 604 that remains laterally between the fifth metal structure 606 and the airgap 618 may be greater than an amount of the third dielectric layer 202 that remains laterally between the third metal structure 206 and the airgap 618 due to a height 620 between the third etch stop layer 136 and the fourth etch stop layer 602 being greater than a height 622 between the fourth etch stop layer 602 and the fifth etch stop layer 608.

In some embodiments, after the airgap 618 is formed, the fifth dielectric layer 610 is formed over the airgap 618 and pinches off to seal the airgap 618. In some embodiments, the fifth dielectric layer 610 is etched to form a ninth recess in which the sixth metal structure 612 is formed and a tenth recess in which the eighth metal structure 616 is formed. In some embodiments, the sixth metal structure 612 and the eighth metal structure 616 are at least one of vias or metal lines within a metal three (M3) back end of line (BEOL) layer.

In some embodiments, a semiconductor arrangement is provided. The semiconductor arrangement includes a gate structure disposed between a first source/drain region and a second source/drain region. The semiconductor arrangement includes a first contact disposed over the first source/drain region. The semiconductor arrangement includes a second contact over the second source/drain region. The semiconductor arrangement includes an airgap disposed between the first contact and the second contact and over the gate structure. In some embodiments, the semiconductor arrangement includes a protection layer disposed between the gate structure and the airgap. In some embodiments, a sidewall of the first contact is in contact with the protection layer. In some embodiments, the semiconductor arrangement includes a dielectric layer disposed over the gate structure and disposed between the gate structure and the airgap. In some embodiments, the dielectric layer is disposed between the first contact and the airgap. In some embodiments, the semiconductor arrangement includes a protection layer disposed between the gate structure and the dielectric layer. In some embodiments, a sidewall of the first contact is in contact with the protection layer. In some embodiments, the semiconductor arrangement includes a first metal structure disposed over the first contact and interfacing with the first contact and a second metal structure disposed over the second contact and interfacing with the second contact. In some embodiments, the semiconductor arrangement includes an etch stop layer. In some embodiments, the airgap extends through the etch stop layer, the airgap has a first width below the etch stop layer and a second width adjacent the etch stop layer, and the first width is greater than the second width. In some embodiments, the airgap is disposed between the first metal structure and the second metal structure. In some embodiments, the semiconductor arrangement includes a dielectric material disposed over the airgap and between the first metal structure and the second metal structure.

In some embodiments, a semiconductor arrangement is provided. The semiconductor arrangement includes a gate structure disposed between a first source/drain region and a second source/drain region. The semiconductor arrangement includes an etch stop layer disposed over the gate structure. The semiconductor arrangement includes a protection layer disposed over the etch stop layer. The semiconductor arrangement includes a second etch stop layer, wherein an airgap is disposed between the protection layer and the second etch stop layer. In some embodiments, the semiconductor arrangement includes a dielectric layer disposed over the protection layer. In some embodiments, the airgap is disposed between the dielectric layer and the second etch stop layer. In some embodiments, the semiconductor arrangement includes a contact disposed over the first source/drain region. In some embodiments, the airgap is separated from the contact by the dielectric layer. In some embodiments, the protection layer includes silicon carbide.

In some embodiments, a method for forming a semiconductor arrangement is provided. The method includes forming a gate structure over a substrate and forming a protection layer over the gate structure. The method includes forming a first dielectric layer over the protection layer and performing a first etch process to expose a first portion of the protection layer. The method includes forming a second dielectric layer over the first dielectric layer, wherein an airgap is defined between the first portion of the protection layer and the second dielectric layer. In some embodiments, the method includes performing a second etch process to expose a second portion of the protection layer prior to forming the second dielectric layer. In some embodiments, the method includes forming a first contact through the first dielectric layer, wherein the second etch exposes a sidewall of the first contact. In some embodiments, forming the second dielectric layer includes forming the second dielectric layer to contact with the sidewall of the first contact. In some embodiments, the method includes forming an etch stop layer over the gate structure, wherein forming the protection layer includes forming the protection layer over the etch stop layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, In an or more embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as CVD, PVD, PECVD, or ALD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
   a gate structure disposed between a first source/drain region and a second source/drain region;
   a first contact disposed over the first source/drain region;

a second contact disposed over the second source/drain region;
a protection layer disposed laterally between the gate structure and the first contact, wherein:
  a portion of the first source/drain region extends between the gate structure and the first contact, and
  the protection layer covers the portion of the first source/drain region;
an airgap disposed between the first contact and the second contact and over the gate structure; and
a first dielectric layer pinching off the airgap, wherein the first dielectric layer is disposed below the airgap and above the airgap.

2. The semiconductor arrangement of claim 1, wherein the protection layer is disposed between the gate structure and the airgap.

3. The semiconductor arrangement of claim 1, wherein a sidewall of the first contact is in contact with the protection layer.

4. The semiconductor arrangement of claim 1, comprising:
a second dielectric layer disposed over the gate structure and disposed between the gate structure and the airgap.

5. The semiconductor arrangement of claim 4, wherein the second dielectric layer is disposed between the first contact and the airgap.

6. The semiconductor arrangement of claim 4, wherein the protection layer is disposed between the gate structure and the second dielectric layer.

7. The semiconductor arrangement of claim 6, wherein a sidewall of the first contact is in contact with the protection layer.

8. The semiconductor arrangement of claim 1, comprising:
a first metal structure disposed over the first contact and interfacing with the first contact; and
a second metal structure disposed over the second contact and interfacing with the second contact.

9. The semiconductor arrangement of claim 8, wherein the airgap is disposed laterally between the first metal structure and the second metal structure.

10. The semiconductor arrangement of claim 8, wherein the first dielectric layer is disposed laterally between the first metal structure and the second metal structure.

11. The semiconductor arrangement of claim 1, comprising:
an etch stop layer, wherein:
  the airgap extends through the etch stop layer,
  the airgap has a first width below the etch stop layer and a second width adjacent the etch stop layer, and
  the first width is greater than the second width.

12. A semiconductor arrangement, comprising:
a gate structure disposed between a first source/drain region and a second source/drain region;
a first etch stop layer disposed over the gate structure;
a protection layer disposed over the first etch stop layer;
a second etch stop layer, wherein:
  an airgap is disposed between the protection layer and the second etch stop layer,
  the first etch stop layer and the protection layer are vertically between the gate structure and a bottom of a portion of the airgap vertically coincident with the gate structure, and
  the first etch stop layer and the protection layer are laterally coincident with the gate structure; and
a first dielectric layer pinching off the airgap, wherein the first dielectric layer is disposed below the airgap and above the airgap.

13. The semiconductor arrangement of claim 12, comprising:
a second dielectric layer disposed over the protection layer, wherein the airgap is disposed between the second dielectric layer and the second etch stop layer.

14. The semiconductor arrangement of claim 13, wherein the first dielectric layer is between the second dielectric layer and the airgap.

15. The semiconductor arrangement of claim 12, wherein the protection layer comprises silicon carbide.

16. A semiconductor arrangement, comprising:
a gate structure;
a first dielectric layer disposed over the gate structure;
a first etch stop layer disposed over the first dielectric layer;
a second dielectric layer disposed over the first etch stop layer; and
a third dielectric layer, wherein:
  the first dielectric layer, the first etch stop layer, and the second dielectric layer define an airgap overlying the gate structure,
  the airgap is laterally coincident with the gate structure,
  the third dielectric layer pinches off the airgap, and
  the third dielectric layer is disposed below the airgap and above the airgap.

17. The semiconductor arrangement of claim 16, wherein:
the airgap has a first width in the first dielectric layer,
the airgap has a second width in the first etch stop layer,
the airgap has a third width in the second dielectric layer, and
the second width is less than the first width and the third width.

18. The semiconductor arrangement of claim 16, comprising:
a protection layer between the gate structure and the airgap, wherein the protection layer comprises carbon.

19. The semiconductor arrangement of claim 18, wherein the protection layer comprises silicon carbide.

20. The semiconductor arrangement of claim 16, comprising:
a second etch stop layer disposed between the gate structure and the airgap; and
a protection layer disposed between the second etch stop layer and the airgap.

* * * * *